United States Patent [19]

Wada et al.

[11] Patent Number: 4,816,496

[45] Date of Patent: Mar. 28, 1989

[54] PHOTOCURABLE COMPOSITION

[75] Inventors: Moriyasu Wada, Ninomiya; Shuichi Suzuki, Yokohama; Yuusuke Wada, Chigasaki; Shuzi Hayase, Kawasaki; Yukihiro Mikogami, Yokohama, all of Japan

[73] Assignee: Kabushiki Kaisha Toshiba, Kawasaki, Japan

[21] Appl. No.: 739,119

[22] Filed: May 30, 1985

[30] Foreign Application Priority Data

| Jun. 26, 1984 | [JP] | Japan | 59-129973 |
| Nov. 27, 1984 | [JP] | Japan | 59-248645 |
| Feb. 28, 1985 | [JP] | Japan | 60-37461 |

[51] Int. Cl.$^4$ .................. C08F 283/10; C08G 57/17; C08L 63/10

[52] U.S. Cl. ......................... 522/17; 522/8; 522/18; 522/33; 522/42; 522/103; 522/24; 522/100; 525/482; 525/922

[58] Field of Search ............... 525/482, 922; 522/171, 522/170, 17, 33, 103

[56] References Cited

U.S. PATENT DOCUMENTS

| 3,301,743 | 1/1967 | Fekete | 525/507 |
| 3,450,613 | 6/1969 | Steinberg | 525/531 |
| 3,887,515 | 6/1975 | Pennington | 525/482 |
| 3,936,557 | 2/1976 | Watt | 525/482 |
| 3,987,127 | 10/1976 | Dickie | 522/107 |
| 4,189,365 | 2/1980 | Schmitt | 522/18 |
| 4,200,705 | 4/1980 | Davis | 525/482 |
| 4,308,394 | 12/1981 | Shuster | 522/103 |
| 4,368,043 | 1/1983 | Yamauchi | 522/103 |
| 4,368,300 | 1/1983 | Nakano | 522/103 |
| 4,413,105 | 11/1983 | Koenig | 525/482 |
| 4,428,807 | 1/1984 | Lee | 522/103 |
| 4,433,124 | 2/1984 | Okamoto | 526/277 |
| 4,487,861 | 12/1984 | Winner | 523/428 |
| 4,495,042 | 1/1985 | Hayase et al. | 204/159.14 |

FOREIGN PATENT DOCUMENTS

| 0101307 | 2/1984 | European Pat. Off. |
| 44-19038 | 8/1969 | Japan |

Primary Examiner—John C. Bleutge
Assistant Examiner—Arthur H. Koeckert
Attorney, Agent, or Firm—Foley & Lardner, Schwartz, Jeffrey, Schwaab, Mack, Blumenthal & Evans

[57] ABSTRACT

Disclosed are photocurable compositions which comprise
(A) a compound having at least one epoxy group and at least one photocurable unsaturated ethylenic double bond within the same molecule;
(B) an organometallic compound and
(C) a silicon compound capable of generating silanol group by irradiation of light, or comprise
(A) a compound having at least one epoxy group and at least one photocurable unsaturated ethylenic double bond within the same molecule;
(E) an epoxy compound;
(F) an organic phosphorus compound; and
(G) a photosensitizer.

The compositions of the present invention have excellent film characteristics such as good adhesion property, light resistance, heat resistance and weathering resistance.

7 Claims, No Drawings

PHOTOCURABLE COMPOSITION

BACKGROUND OF THE INVENTION

This invention relates to a photocurable composition, more particularly to a photocurable composition which has good photocurability and rapid curability as well as excellent coating workability such as flowability, smoothness and uniformity of the coated film, and can also give a cured product having excellent adhesiveness, coating performance, heat resistance and weathering resistance.

Photocurable resin compositions, having generally advantages in aspects of conservation of energy, conservation of resources, saving of space and counter-measures against pollution, are now under aggressive researches and developments in various fields such as ink, paint and varnish. Accordingly, demands in aspect of performance corresponding to respective fields are also increasing.

For example, in photocurable resin compositions to be used for paint, it is desired to improve physical properties of the coated film, particularly adhesiveness, heat resistance and toughness. However, in resin compositions based on acrylic resins, while having an advantage of rapid curing speed, there is involved the drawback of poor adhesiveness. Also, for improvement of coated film performance of said acrylic resins, attempts have been made to solve the problem by formulating heat resistant resins or tough resins to copolymerize sid resins with acrylic resins. In any case, while some improvements of respective physical properties may be recognized, the composition will suffer from solidification or thickening to be limited in improvements of respective physical properties. Thus, the problem remains with respect to working characteristics.

More specifically, one proposal is a photocurable composition comprising an epoxy resin and an acrylic (methacrylic) resin. The specific feature of the photocuring mechanism in this composition resides in modifying the epoxy resin with acrylic acid, etc. in order to introduce acryloyl groups having photocurability into the epoxy resin and photopolymerizing the vinyl groups introduced. However, the cured product obtained from this composition had the drawback of being lowered in characteristics such as heat resistance and adhesiveness as compared with the epoxy resin itself [see "The Present Situation and Future Development of UV-curable Paint" in Coating & Paint, May (No. 324), p. 45, 1980].

Another known composition is a photocurable composition comprising an epoxy resin and a photocurable catalyst of the type releasing strong acid (see Macromolecules, Vol. 10, p. 1037, 1977).

The specific feature of photocuring mechanism in this composition resides in curing the composition by utilizing the photolytic activity of the catalyst represented by the formula:

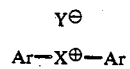

wherein Ar represents a group such as phenyl, X an iodine atom, a sulfur atom or a diazo group and Y $BF_4$, $PF_6$, $AsP_6$ or $SbF_6$.

However, in the cured product obtained from this composition, while having good mechanical characteristics and heat resistance, there are involved the drawbacks such the characteristics of the cured product will be deteriorated by heating or with lapse of time, and also that corrosive phenomenon of the cured product will be brought about, because the catalyst component is a strong acid which will become an ionic impurity. Also, this composition had a great drawback in difficult handleability, and also a drawback of having no adhesive force at all when cured rapidly.

SUMMARY OF THE INVENTION

An object of the present invention is to provide a photocurable composition, comprising an epoxy compound as the base, which is excellent in coated film characteristics, particularly adhesion property and low in viscosity.

Another object of the present invention is to provide a photocurable composition, which is excellent in rapid curing characteristic and can also give a cured product having good coating performance, heat resistance and weathering resistance.

Still another object of the present invention is to provide a photocurable composition which is good in curability and also excellent in coating characteristics such as flowability, smoothness and uniformity of coated film.

The present inventors have accomplished the present invention by use of a reaction product of a low viscosity epoxy monomer compound which is usually called as diluent with a compound having an unsaturated double bond as the material corresponding to the acrylic resin of the prior art.

More specifically, the photocurable composition of the present invention comprises:

(A) a compound having at least one epoxy group and at least one photocurable unsaturated ethylenic double bond within the same molecule;

(B) an organometallic compound; and (C) a silicon compound capable of generating silanol group by irradiation of light.

The above photocurable composition of the present invention may further contain:

(D) an antioxidant and/or a surfactant.

In the present invention, according to another embodiment, the photocurable composition comprises:

(A) a compound having at least one epoxy group and at least one photocurable unsaturated ethylenic double bond within the same molecule;

(E) an epoxy compound;

(F) an organic phosphorus compound; and (G) a photosensitizer.

DESCRIPTION OF THE PREFERRED EMBODIMENTS

The compound (A) to be used in the composition of the present invention may be any compound, provided that it has at least one epoxy group and at least one photocurable unsaturated ethylenic double bond, respectively, in the same molecule. Said compound can be obtained by addition of a low viscosity epoxy monomer conventionally called as diluent and a compound having a photocurable unsaturated ethylenic double bond. By this reaction, an unsaturated epoxy compound having a much lower viscosity than the epoxyacrylate type resin of the prior art can be obtained.

The epoxy monomer compound to be used in the above addition reaction may be a compound having any viscosity of 200 cPs or lower, but the viscosity is desirably as low as possible in view of workability. Said epoxy compound may include compounds having groups as represented by the following formulae:

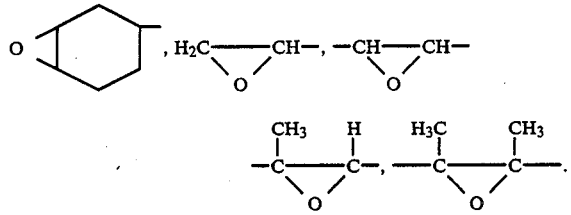

Specifically, there may be included those conventionally called as epoxy diluents in the prior art, for example, vinylcyclohexene diepoxide

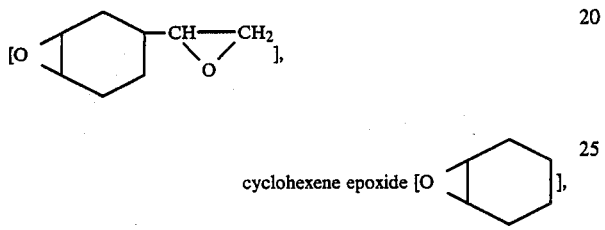

tert-fatty acid monoglycidyl ether, glycerol glycidyl ether, polyglycol diglycidyl ether, alkylmonoglycidyl ether, alkylphenol monoglycidyl ether, vinyl cyclohexene epoxide

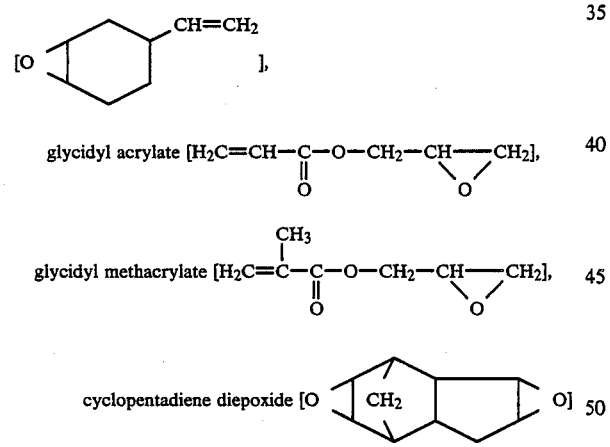

and the like.

On the other hand, the compound having a photocurable unsaturated ethylenic double bond may include the compounds having groups represented by the following formulae: $CH_2=CH-$, $-CH=CH-$,

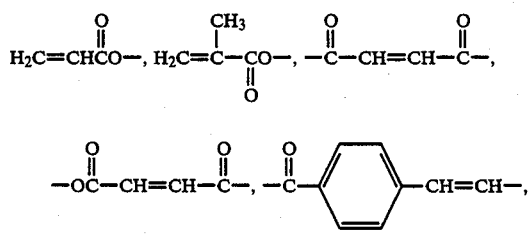

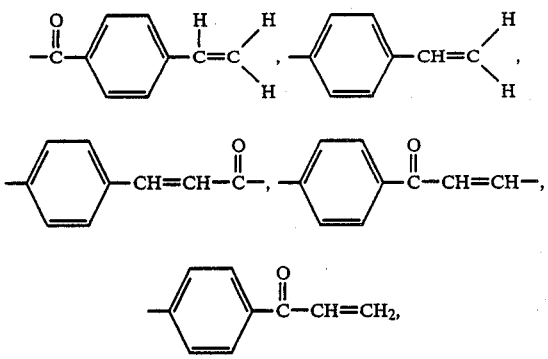

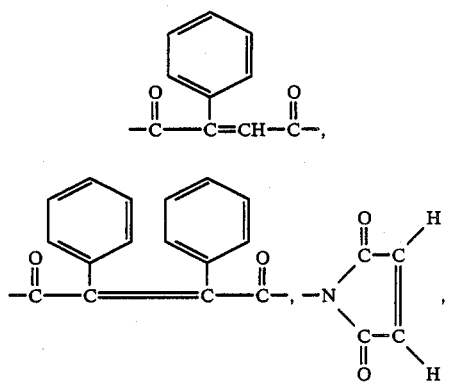

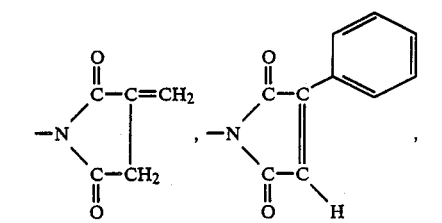

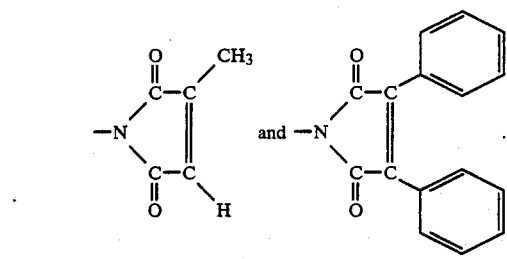

Specifically, there may be included acrylic acid, methacrylic acid, cinnamic acid, maleic acid, fumaric acid, styrene, α-methyl styrene, stilbene, furan, dihydrofuran, pyrrole, imidazole and derivatives of these. Among them, it is preferable to use at least one selected from the group consisting of acrylic acid, methacrylic acid, maleic acid and fumaric acid.

In the epoxy compound and the compound having an unsaturated ethylenic double bond, hyrogen atoms bonded to carbon atom may be substituted by halogen atoms such as chlorine and fluorine, alkyl groups such as methyl group, aromatic groups such as phenyl group or other functional groups.

The addition reaction of both compounds as described above may be carried out by refluxing these compounds in the presence of a polymerization inhibitor and an alkaline reagent in a solvent. In said reaction, the epoxy compound is formulated in an amount over equal moles, preferably two or more moles per mole of the compound having a double bond. As the solvent, a low polar solvent such as toluene may be used, while quinones such as hydroquinone may be used as the polymerization inhibitor and uaternary ammonium salts, amines, etc. may be used as the alkaline agent. The reaction temperature may be generally 100° to 120° C., and the reaction time is generally 2.0 to 9.0 hours. After completion of the reaction, the product can be treated in a conventional manner such as extraction or solvent evaporation to give a low viscosity unsaturated epoxy compound.

This compound can be constituted by synthesizing as desired according to a molecular design depending on the purpose as described above. However, on the other hand, it is also possible to synthesize readily the compound by allowing acrylic acid, methacrylic acid, cinnamic acid, maleic acid or the like to react with a conventionally used epoxy resin. As the epoxy resin employed in the latter method, there may be included bisphenol A type epoxy resins; bisphenol F type epoxy resins; phenol novolac type epoxy resins; alicyclic epoxy resins; heterocyclic ring-containing epoxy resins such as triglycidyl isocyanurate or hydantoin epoxy; hydrogenated bisphenol A type epoxy resins; aliphatic epoxy resins such as propylene glycol-diglycidyl ether, pentaerythritolpolyglycidyl ether; epoxy resins obtained by the reaction of aromatic, aliphatic or alicyclic carboxylic acids with epichlorohydrin; spiro ring-containing epoxy resins; glycidyl ether type epoxy resins which are reaction products of o-allylphenol novolac compounds with epichlorohydrin; and glycidylether type epoxy resins which are reaction products of diallylbisphenol compounds having allyl groups at the o-positions of the respective hydroxyl groups of bisphenol A with epichlorohydrin. At least one selected from these groups can be employed as desired.

Specific examples of said compound may include addition compounds in which the proton eliminated group of the above compound having ethylenic double bond is bonded to the epoxy group moiety of the above epoxy compound, more specifically those represented by the following formulae:

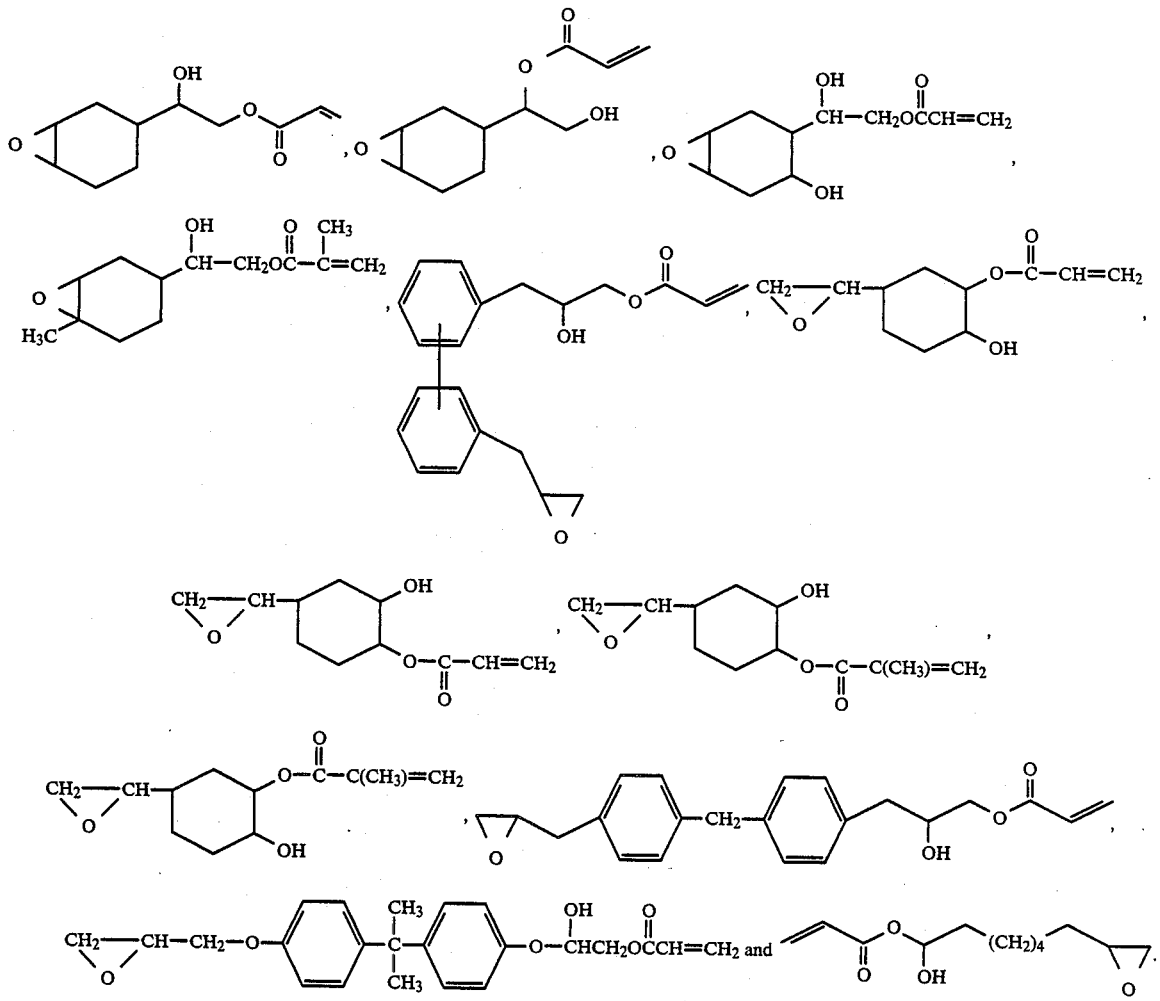

The organometallic compound (B) used in the first embodiment is a catalyst for polymerization of the epoxy group in the component (A). Accordingly, any compound may be available having such an action, but an organic aluminum compound is preferred for greater activity to promote the reaction rate.

Typical examples of such organic aluminum compounds may include trismethoxyaluminum, trisethoxyaluminum, trisisopropoxyaluminum, trisphenoxyaluminum, tris(p-methylphenoxy)aluminum, isopropoxydiethoxyaluminum, tributoxyaluminum, trisacetoxyaluminum, aluminum trisstearate, aluminum trisbutyrate, aluminum trispropionate, aluminum trisisopropionate, trisacetylacetonatoaluminum, tris(trifluoroacetylacetonato)aluminum, tris(hexafluoroacetylacetonato)aluminum, aluminum trisethylacetoacetate, aluminum trissalicylaldehyde, aluminum tris(diethylmalonate), aluminum trispropylacetoacetate, aluminum trisbutylacetoacetate, tris(dipivaloylmethanato)aluminum, diacetylacetonatodipivaloylmethanatoaluminum,

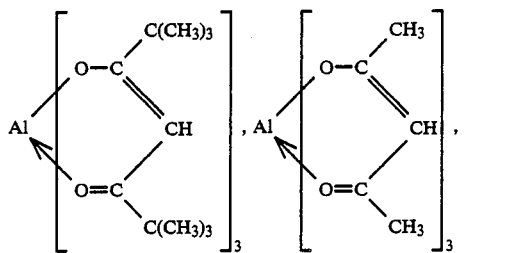

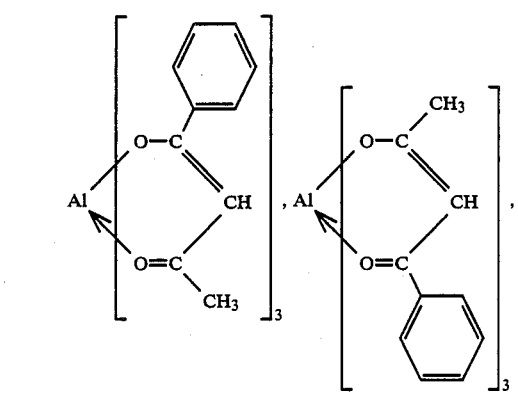

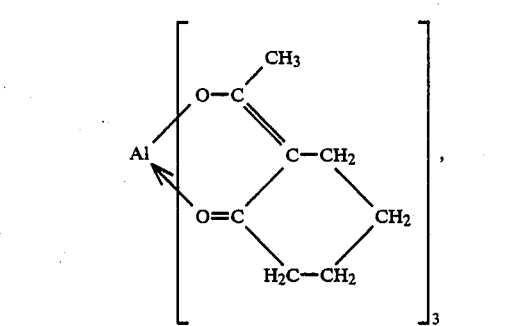

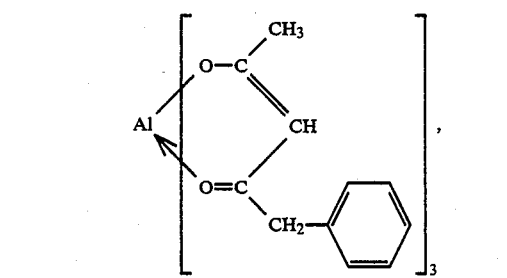

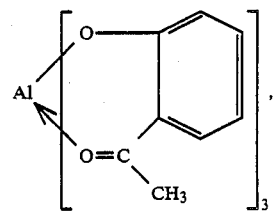

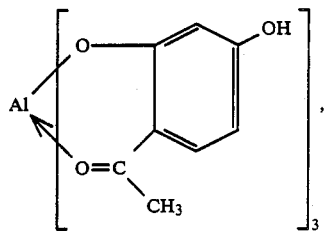

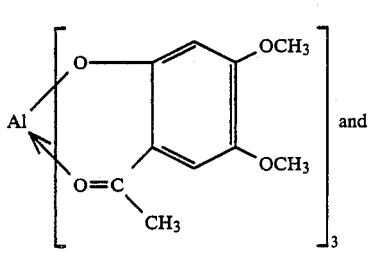

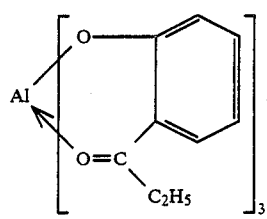

Other organometallic compounds may include complexs in which alkoxy groups, phenoxy groups, acyloxy groups, β-diketonato groups, o-carbonylphenolato groups are bonded to metal atoms such as titanium, vanadium, chromium, manganese, iron, cobalt, nickel, copper, zinc, zirconium, etc.

Specific examples of these compounds may include titanium tetraethoxide, titanium tetrabutoxide, phenyl dimethyl vanadium, ferrocene, diphenyl nickel, diethyl iron, cobalt carbonyl, dibenzene chromium, dimethyl zinc, diisopropyl zirconium, dipyridyl copper, nickel o-carbonylphenolate, manganese diacyloxide and the like.

The compound (B) may be formulated at a proportion generally of 0.001 to 10% by weight, preferably 0.1 to 5% by weight based on the component (A). If the amount is less than 0.001%, no sufficient curing characteristic can be obtained, while an amount in excess of 10% will bring about increased cost and lowering in adhesiveness.

The silicon compound (C) to be used in the present invention may be any compound capable of forming silanol group by irradiation of light, including, for example, organic silicon compounds, inorganic silicon compounds, silicon-containing polymers (silicone), silicone oils and the like. Among them, a silicon compound having either one of peroxysilyl group, o-nitrobenzyloxy group and α-ketosilyl group is preferred.

Of these silicon compounds, those having a peroxysilyl group are those represented by the following formula:

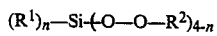

(wherein $R^1$ and $R^2$ may be either identical or different and each represent a hydrogen atom, a halogen atom, an alkyl group having 1 to 5 carbon atoms or an aryl group, and n is an integer of 0 to 3).

In the above formula, the alkyl group having 1 to 5 carbon atoms may be, for example, a methyl group, an ethyl group, an isopropyl group, an n-propyl group, an n-butyl group, a t-butyl group, an iso-buty group, an n-pentyl group, a methoxy group, an ethoxy and a chloromethyl group; the aryl group may be, for example, a phenyl group, a naphthyl group, an anthranyl group and a benzyl group; and the alkyl group having 1 to 5 carbon atoms and the aryl group may also have substituents such as halogen atoms, a nitro group, a cyano group, a methoxy group, etc.

Typical examples of such silicon compounds may include:

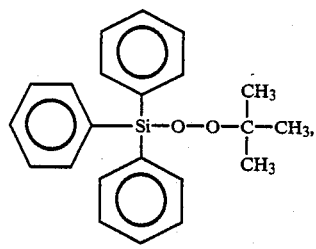

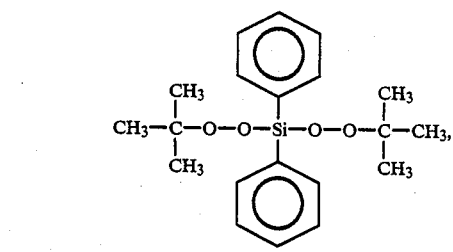

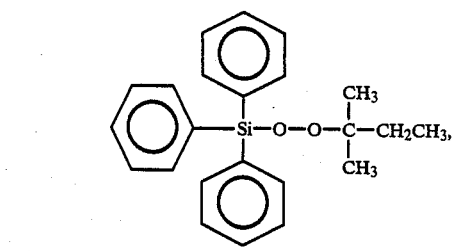

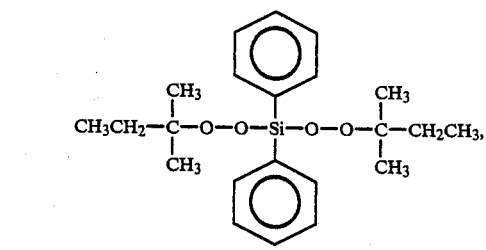

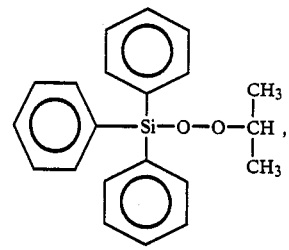

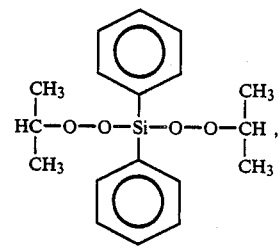

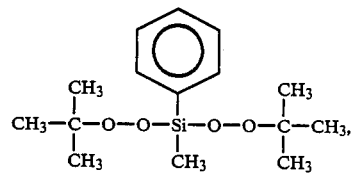

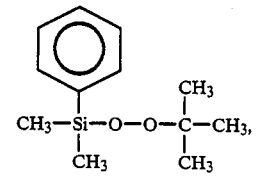

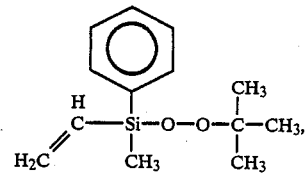

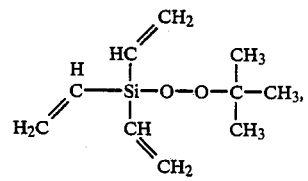

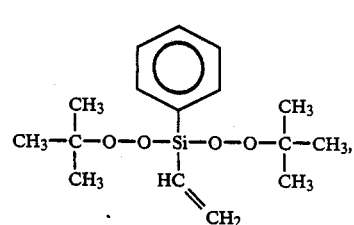

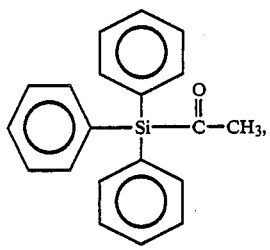

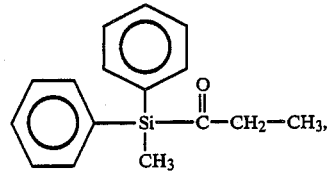

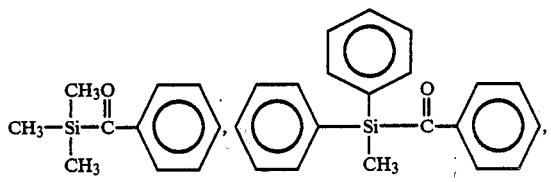

trimethyl(o-nitrobenzyloxy)silane, dimethylphenyl(o-nitrobenzyloxy)silane, diphenylmethyl(o-nitrobenzyloxy)silane, triphenyl(o-nitrobenzyloxy)silane, vinylmethylphenyl(o-nitrobenzyloxy)silane, t-butylmethylphenyl(o-nitrobenzyloxy)silane, triethyl(o-nitrobenzyloxy)silane, di(2-chloroethyl)-o-nitrobenzyloxysilane, tri(p-trifluoromethylphenyl)-o-nitrobenzyloxysilane, trimethyl[α-(o-nitrophenyl)-o-nitrobenzyloxy]silane, dimethylphenyl[α-(o-nitrophenyl)-o-nitrobenzyloxy]silane, methylphenyldi[α-(o-nitrophenyl)-o-nitrobenzyloxy]silane, triphenyl(α-ethyl-o-nitrobenzyloxy)silane, trimethyl(3-methyl-2-nitrobenzyloxy)silane, dimethylphenyl(3,4,5-trimethoxy-2-nitrobenzyloxy)silane and triphenyl(4,5,6-trimethoxy-2-nitrobenzyloxy)silane.

The component (C) may be formulated at a proportion generally of 0.1 to 20%, preferably 1 to 10%, by weight based on the component (A). If the proportion is less than 0.1%, no sufficient curing characteristic can be obtained. On the other hand, use of a proportion over 20% may be possible, but it will result in increased cost and generation of decomposed products.

The photocurable composition according to the first embodiment of the present invention may also contain an antioxidant and/or a surfactant as the component (D). When the antioxidant and the surfactant are used jointly, excellent effects can be recognized.

The antioxidant (D) to be used in the composition of the present invention of any one, so far as antioxidant effect can be recognized. There may be include, for example, phenolic antioxidants, sulfur antioxidants, phosphorus antioxidants and the like.

Phenolic antioxidants may include, for example, 2,6-di-tert-butyl-p-cresol, butylated hydroxyanisole, 2,6-di-tert-butyl-4-ethylphenol, stearyl-β-(3,5-di-t-butyl-4-hydroxyphenyl)propionate, 2,2'-methylene-bis-(4-methyl-6-tert-butylphenol), 2,2'-methylene-bis-(4-ethyl-6-tert-butylphenol), 4,4'-thio-bis-(3-methyl-6-tert-butylphenol), 4,4'-butylidene-bis-(3-methyl-6-tert-butylphenol), 1,1,3-tris-(2-methyl-4-hydroxy-5-tert-butylphenyl)butane, 1,3,5-trimethyl-2,4,6-tris-(3,5-tert-butyl-4-hydroxybenzyl)benzene, tetrakis-[methylene-3-(3',5'-di-tert-butyl-4'-hydroxyphenyl)propionate]methane, bis-[3,3'-bis-(4'-hydroxy-3'-tert-butylphenyl)butyric acid]glycol ester, tocopherol and the like.

Sulfur antioxidants may include, for example, dilauryl.thiodipropionate, dimyristyl.thiodipropionate, distearyl.thiodipropionate and the like.

Phosphorus antioxidants may include, for example, triphenyl phosphite, diphenylisodecylphosphite, phenyldiisodecylphosphite, 4,4'-butylidene-bis-(3-methyl-6-tert-butylphenyl-di-tridecyl)phosphite, tris(nonyl.phenyl)phosphite and the like.

These antioxidants may be used either singly or as a combination of two or more compounds.

Among these antioxidants, it is particularly preferred to employ a phenol antioxidant or a phosphorus antioxidant.

The antioxidant may be used at a proportion generally of 0.01 to 10%, preferably 0.1 to 3%, by weight based on the component (A). If the proportion is less than 0.01% by weight, no effect can be obtained, while a proportion over 10% will interfere with photocurability.

The surfactant (D) to be used in the composition of the present invention may be any surfactant, which can improve the leveling characteristic or working characteristic of the coated film. Specific examples of the component (D) may include, for example, a perfluoro acid such as $C_9F_{19}COOH$, $C_7F_{15}COOH$, $C_5F_{11}COOH$, $C_3F_7COOH$, $C_2F_5-COOH$ and $CF_3COOH$; a fluorine-containing compound such as $H(CF_2)_3COOK$, $H(CF_2)_3COONa$, $H(CF_2)_{10}COOK$, $H(CF_2)_{10}COONa$, $H(CF_2)_{12}COOK$, $H(CF_2)_{12}COONa$, $C_8F_{17}SO_3N(C_2H_5)(CH_2)_2OH$, $C_8F_{17}SO_3N(C_2H_5)SO_4Na$, $H(CF_2)_8PO(OH)_2$, $CF_3(CF_2)_6(CH_2)_5COO-Na$, $CF_3(CF_2)_6CH=CH(CH_2)_3COONa$, $C_7F_{15}CONHC_3H_6N(CH_3)_2C_2H_4-COOH$ and $C_7H_{15}CONHC_3H_6N(CH_3)_3I$; an organic surface active agent such as nonionic surface active agents, e.g., a laurate, a stearate, an oleate, lauryl alcohol oleil alcohol, an alkyl phenol, octyl phenol, myristate, etc.; a silane compound such as tetramethyldisiloxane, polydimethylsiloxane, polymethylhydrosiloxane, polymethylhydro-dimethylsiloxne, polyethylhydrosiloxane, polydimethyl-polydiphenylsiloxane, polydimethyl-polymethylvinylsiloxane, polydimethylsiloxanemethylvinyl, polydimethylvinylsiloxane, polymethylphenetylsiloxanevinyl, bis(vinyldimethylsilyl)benzene, vinylmethylsiloxane, polydiphenylsiloxane, polydimethyl-diphenylsiloxane, bis(hydroxydimethylsilyl)benzene, polytetramethyl-p-silylphenylenesiloxane, polydimethylsiloxanecarbinol, polydimethylsiloxanehydroxypropyl, polydimethyl-hydroxyalkyleneoxidemethylsiloxane, bis(aminopropyldimethyl)siloxane, bis(aminopropyldimethylsilyl)benzene, 1,3-bis(chloromethyl)tetramethyldisiloxne, 1,3-bis(chloropropyl)tetramethyldisiloxane, polydimethyl-chloropropylmethylsiloxane, tetramethyldichlorodisiloxane, 1,5-dichlorohexamethyltrisiloxane, polydimethyl-methacryloxypropylmethylsiloxane, polymercaptopropylmethylsiloxane, polymethyl-3,3,3-trifluoropropylsiloxane, polymethyl-1,1,2,2-tetrahydroperfluorooctylsiloxane, polymethylethylsiloxane, polymethyloctylsiloxane, polymethyloctadecylsiloxane, tetraphenyldimethyldisiloxane, tetraphenyltetramethyltrisiloxane, pentaphenyltrimethyltrisiloxane, polyphenylsilsesquioxane, poly-boron-diphenylsiloxane, (N-trimethoxysilylpropyl)-O-polyoxyethyleneoxideurethane, triethoxysilylpoly(1,2-butadiene), tetra-n-butoxysilane, tetra-sym-butoxysilane, tetrakis(2-ethylbutoxy)silane, tetrakis(2-ethylhexoxy)silane, tetrakis(2-ethylbutoxy)disiloxane, methyltris(trisym-butoxysiloxanyl)silane and the like.

Among them, the fluorine-containing compounds are particularly preferred for good leveling chracteristic and silicone compounds for good coating workability.

The amount of the surfactant employed may be generally 0.05 to 5% by weight, preferably 0.1 to 1.0% by weight, based on the total amount of the components (A), (B) and (C). If the amount is less than 0.05% by weight, its leveling characteristic or the so-called coating workability such as wettability, etc. will have a problem, while an amount in excess of 5% by weight will have adverse effect on curability or tackiness of the surface.

In the present invention, when a surfactant is added, it is also possible to use a curing accelerator or an organic solvent. These may be any kind of compounds, which can contribute to improvement of coating workability. Specific examples may include naphthenic acid metal salts, as a curing accelerator, such as cobalt naphthenate, iron naphthenate, manganese naphthenate, nickel naphthenate, copper naphthenate, lead naphthenate, cadmium naphthenate, molybdenum naphthenate, terbium naphthenate, tantalum naphthenate, tin naphthenate, chromium naphthenate, gallium naphthenate, zinc naphthenate, germanium naphthenate and the like; and organic solvents such as toluene, xylene, methyl ethyl ketone, ethyl acetate, petroleum benzine, methanol, ethanol, n-hexane, cyclohexane, acetone, etc., and at least one selected from the group consisting of these may be used.

In the amount employed of the curing accelerator or the organic solvent, the proportion of the naphthenic acid metal salt may generally be, as a 20% solvent solution, 0.01 to 5.0% by weight, preferably 0.05 to 1.0% by weight based on the total amount of the components (A)–(D). If the amount is less than 0.01% by weight, no improvement of coating workability can be effected, while an amount in excess of 5.0% by weight will lower markedly coating workability. On the other hand, the organic solvent may be used in an amount generally of 2.0% by weight or less, preferably from 0.5 to 1% by weight, based on the total amount of the components (A)–(D). If this amount exceeds 2.0% by weight, curability is particularly lowered.

As the solvent when employing a naphthenic acid metal salt, xylene, toluene, methyl ethyl ketone, methyl isobutyl ketone, etc. may be employed.

The composition of the present invention may also incorporate a photosensitizer, if necessary. As such a photosensitizer, there may be employed any of the respective components as mentioned above, which can effect photosensitization, as exemplified by aromatic hydrocarbons, benzophenone and derivatives thereof, o-benzoyl benzoic acid esters, acetophenone and derivatives thereof, benzoin and benzoin ether, and derivatives thereof, xanthone and derivatives thereof, thioxanthone and derivatives thereof, disulfide compounds, quinone compounds, halogenated hydrocarbons and amines.

Next, the second embodiment of the present invention is to be explained. Also in the second embodiment, similarly as in the above first embodiment, the component (A) having at least one epoxy group and at least photocurable unsaturated ethylenic double bond in the same molecule is used.

The epoxy compound (E) to be used in the second embodiment is a component for improving adhesiveness of the component (A). The number of epoxy groups in one molecule of the compound may be any of 1 or more, but preferably a plural number, particularly 2 to 3.

Typical examples of the above compound may include epoxy-modified compounds of novolac type phenol resins, specifically o-cresol novolac epoxy resins, m-cresol novolac epoxy resins, p-cresol novolac epoxy resins. Also, as oil soluble novolac epoxy resins belonging to said epoxy-modified compounds, there may be employed p-tert-butylphenol epoxy resins, nonylphenol epoxy resins, etc.; as divalent phenol epoxy resins, resorcinol novolac epoxy resins, catechol novolac epoxy resins, hydroxynovolac epoxy resins, etc.; as resins imparted with heat resistance, o-, m- or p-fluoro, bromo or iodo halogenated phenol novolac epoxy resins, etc.; modified novolac epoxy resins such as novolac epoxy resins modified with aniline, melamine, aminobenzene, etc., xylene-modified novolac epoxy resins and unsubstituted phenol novolac epoxy resins. It is also possible to use non-novolac type modified phenol resins represented by the following formulae:

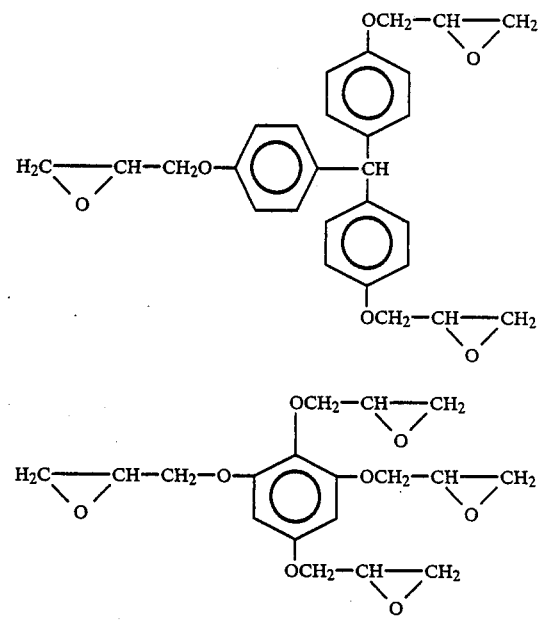

These compounds may be used either singly or as a mixture of two or more compounds.

The above compound may be formulated in the composition according to the second embodiment in an amount of 1 to 80% by weight, preferably 15 to 30% by weight, based on the total amount of the components (A) and (E).

Also, in the first embodiment, for the purpose of further improving adhesiveness, the epoxy compound (E) may be formulated at the same proportion as specified above.

The organic phosphorus compound (F) to be used in the second embodiment is a component which improves adhesiveness of the component and also accelerated the curing speed. Specific examples of such compounds may include, for example, phosphates such as 2-methacryloyloxyethylphosphate, 2-acryloyloxyethylphosphate, diphenyl-2-methacryloyloxyethylphosphate, diphenyl-2-acryloyloxyethylphosphate, bis methacryloyloxybutylphosphate, bisacryloyloxybutylphosphate, diallyldibutylphosphonosuccinate, etc.; alkylphosphates such as trimethylphosphate, triethylphosphate, tributylphosphate, etc.; alkoxyphosphates such as trimethoxyphosphate, tributoxyphosphate, etc.; other phosphate such as trisdichloropropylphosphate, triphenylphosphate, tricresylphosphate, etc.; phosphites such as triphenylphosphite, trilauryl.trithiophosphite, dibutenylhydrogenphosphite, etc.; phosphonates such as dibutyl.butylphosphonate, di(2-ethylhexyl)-2-ethylhexylphosphonate, 2-ethylhexylphosphonic acid, etc. These compounds may be used either singly or as a mixture of two or more compounds.

The above organic phosphorus compound may be formulated in the composition according to the second embodiment in an amount of 0.01 to 10 parts by weight, preferably 0.1 to 2.0 parts by weight, based on 100 parts by weight of the total amount of the components (A) and (E). If the proportion is less than 0.01% by weight, no effect can be obtained, while a proportion over 10% will cause geration of the composition because of the reaction with the epoxy compounds.

The photosensitizer (G) to be used in the second embodiment may be any one which can photosensitize the above compound (A), and it can suitably be selected depending on the components to be formulated as well as the light source, etc.

Such photosensitizers may include, for example, aromatic hydrocarbons, benzophenone and derivatives thereof, esters of o-benzoylbenzoic acids, acetophenone and derivatives thereof, benzoin and benzoin ethers and derivatives thereof, xanthone and derivatives thereof, thioxanthone and derivatives thereof, disulfide compounds, quinone compounds, halogenated hydrocarbons, amines, etc.

Examples of the aromatic hydrocarbon may include benzene, benzene-$d_6$, toluene, p-xylene, fluorobenzene, chlorobenzene, bromobenzene, iodobenzene, naphthalene, 1-methylnaphthalene, 2-methylnaphthalene, 1-fluoronaphthalene, 1-chloronaphthalene, 2-chloronaphthalene, 1-bromonaphthalene, 2-bromonaphthalene, 1-iodonaphthalene, 2-iodonaphthalene, 1-naphthol, 2-naphthol, biphenyl, fluorene, p-terphenyl, acenaphthene, p-quaterphenyl, triphenylene, phenanthrene, azulene, fluoranthene, chrycene, pyrene, 1,2-benzpyrene, anthracene, 1,2-benzanthracene, 9,10-dichloroanthracene, 9,10-dibromoanthracene, 9,10-diphenylanthracene, perylene, tetracene, pentacene, etc.

Examples of the benzophenone and the derivatives thereof may include benzophenone, 2,4-dimethylbenzophenone, 2,4-dichlorobenzophenone, 4,4'-bis(dimethylamino)benzophenone, etc.

Examples of the esters o-benzoylbenzoic acids may include methyl o-benzoylbenzoate, ethyl o-benzoylbenzoate, phenyl o-benzoylbenzoate,

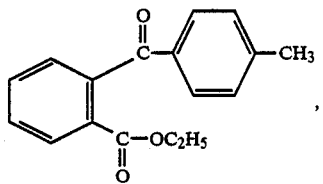

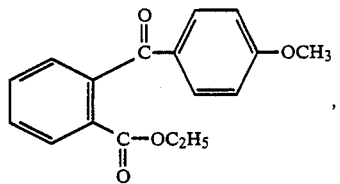

,

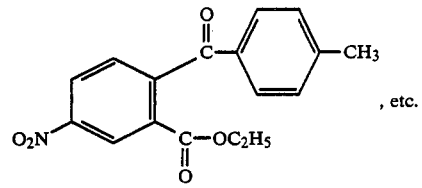

, etc.

Examples of the acetophenone and the derivatives thereof may include acetophenone, 4-methylacetophenone, 3-methylacetophenone, 3-methoxyacetophenone, etc.

Examples of the benzoin, the benzoin ethers and the derivatives of these may include benzoin, benzoin methyl ether, benzoin ethyl ether, benzoin isopropyl ether, benzoin n-butyl ether, benzoin triphenylsilyl ether,

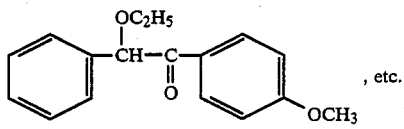

, etc.

Examples of the xanthone and the derivatives thereof may include xanthone, 2,4-dimethylxanthone, 2,4-dichloroxanthone, etc.

Examples of the thioxanthone and the derivatives thereof may include thioxanthone, 2,4-dimethylthioxanthone, 2,4-dichlorothioxane, etc.

Examples of the disulfide compounds may include;

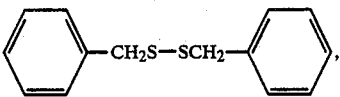,

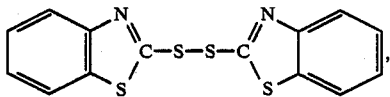,

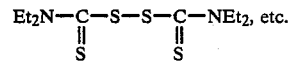 etc.

Examples of the quinone series compounds may include benzoquinone, naphthoquinone, anthraquinone, 5,12-naphthacene dione, 2,7-pyrene dione, etc.

Examples of the halogenated hydrocarbons may include carbon tetrachloride, hexachloroethane, carbon tetrabromide,

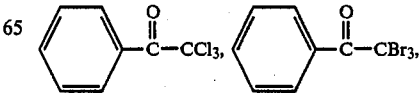

-continued

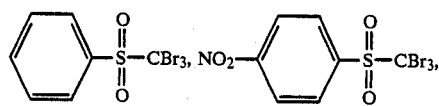
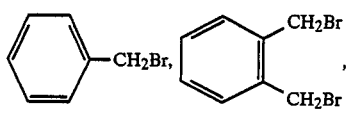
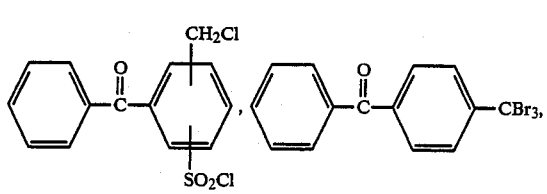
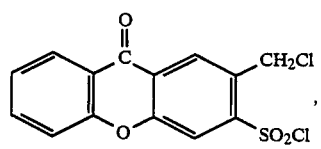
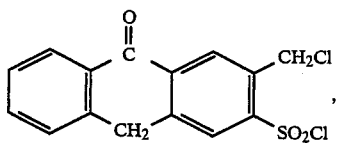
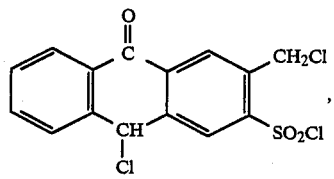
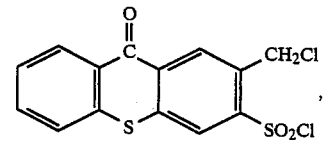
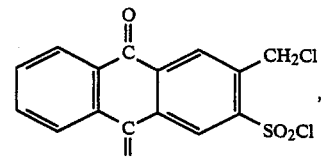
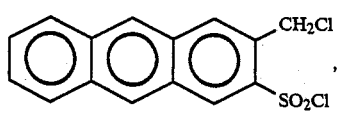
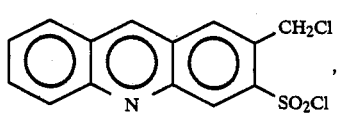
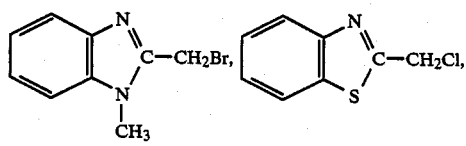

-continued

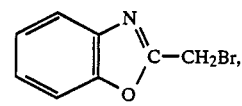
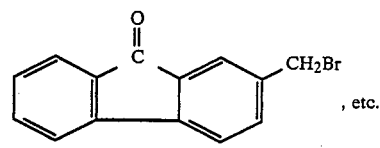

, etc.

Examples of the amines may include diphenylamine, carbazole, triphenylamine,

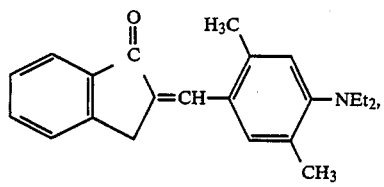
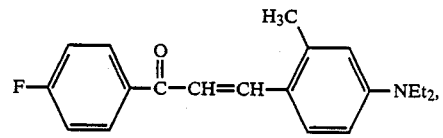
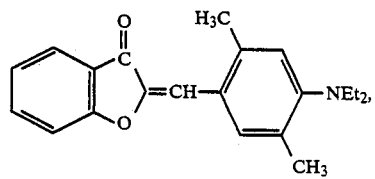
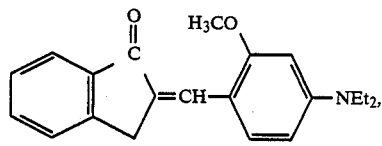
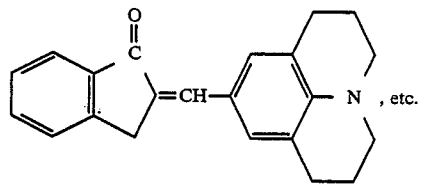

, etc.

Examples of the other photosensitizers may include propiophenone, anthrone, benzaldehyde, butylophenone, 2-naphthylphenylketone, 2-naphthaldehyde, 2-acetonaphthone, 1-naphtylphenylketone, 1-acetonaphthone, 1-naphthoaldehyde, fluorenone, 1-phenyl-1,2-propane dione, benzoethrile, acetone, biacetyl, acridine orange, acridine, Rhodamine-B, eosine, fluorescein,

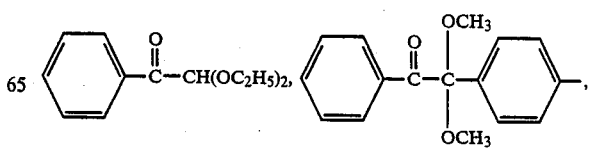

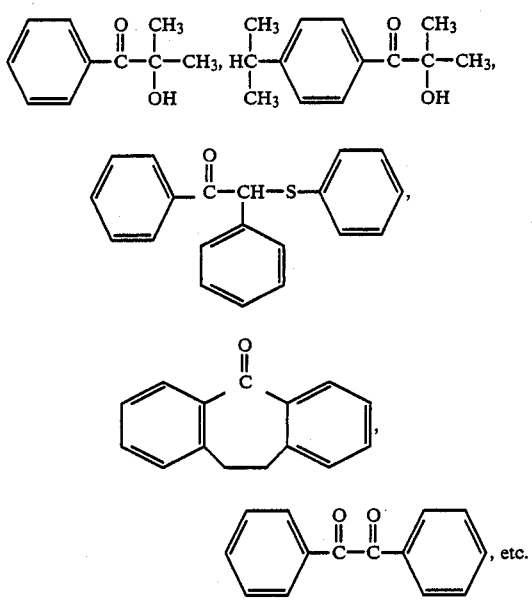

In the compositions as described above, each the components (B) and (C) in the first embodiment and the components (F) and (G) in the second embodiment may be used as a single species or two or more species, and incorporated at a proportion generally within the range from 0.01 to 10% weight based on the resin component [the component (A) in the first embodiment, and the components (A) and (E) in the second embodiment].

Further, in the photocurable compositions according to the first and the second embodiments, in addition to above components, colorants, inorganic fillers or other additives may also be incorporated, if desired.

The photocurable composition of the present invention can be cured according to any desirable curing method, depending on the purpose and the use, such as normal temperature photocuring, heating photocuring, after-cure which is effected after the photocuring, etc. to be provided for practical use. The wavelength of the light irradiated in such curing may differ depending on the composition of the photocurable composition, but it is generally 180 to 700 nm. Above all, irradiation of UV-ray is effective. The irradiation time may differ depending on the composition of the photocurable resin, the kind of the catalyst and light source, but it is generally 0.1 second to 180 minutes, preferably 1 second to 10 minutes. The heating temperature in the case of heating photocuring may be generally 20° to 200° C., preferably 60° to 150° C. As the light source, any one conventionally used for photocuring may be available, including, for example, low pressure mercury lamp, high pressure mercury lamp, carbon arc lamp, metal halide lamp, xenon-mercury lamp, xenon-lamp, hydrogen discharge tube, tungsten lamp, halogen lamp, sodium discharge tube, neon discharge tube, argon discharge tube, He-Ne laser, Ar ion laser, N₂ laser, Cd ion laser, He-Cd laser, dye laser and various electron beams and radioactive rays such as X-ray, and others. One or two or more light sources selected from the group consisting of these may suitably be used.

According to the composition of the present invention, its adhesiveness can be improved without impairing the characteristics of the acrylic compound which is the base of said composition. Also, since a low viscosity unsaturated epoxy resin as different from the acrylic resin of the prior art is employed, there is no fear of worsening in workability due to solidification or thickening of the composition. Accordingly, for improvement of various coated film characteristics, other resins can easily be formulated to be copolymerized. Also, the photocurable composition of the present invention has good photocurability to be cured rapidly, and also excellent working characteristics such as flowability, smoothness and uniformity of coated film. Further, the cured product obtained has good light resistance, heat resistance and weathering resistance.

Therefore, the composition of the present invention is useful as very excellent photocurable composition in various fields such as ink, paint, adhesive, surface coating material, printing plate material, encapsulating material, electric insulating material, etc., and its industrial value may be appreciated to be great. This invention will be described in greater detail by giving the following Examples.

EXAMPLES 1–8

Into a four-necked flask equipped with a thermometer, a reflux condenser, a N₂ gas inlet and a stirrer, 300 g of vinylcyclohexene epoxide (trade name: ERL-4206, produced by UCC, alicyclic epoxide, epoxy equivalent: 70), 140 g of acrylic acid, 200 g of toluene, 0.005 g of hydroquinone and 1.5 g of trimethylamine as the catalyst were charged. After replacement with N₂ gas, the mixture was gradually elevated in temperature under stirring and the reaction was carried out under the reflux temperature of toluene. Progress of the reaction was monitored by measuring the amount of consumed acrylic acid with 0.1N standard NaOH solution, and the reaction was terminated when acid value becames substantially 0.

After completion of the reaction, the reaction solution was mixed with 1000 cc of deionized water, washed six times and then the toluene layer was separated by a separating funnel, followed by evaporation of toluene under reduced pressure. By this reaction, an acrylic acid epoxy resin (abbreviated as VHEA) having a viscosity of 2500 cPs (25° C.) and an epoxy equivalent of about 500 was obtained. In addition to the VHEA obtained, by use of a cresol novolac type epoxy resin EOCN-102S (trade name, melting point: 50° C. or higher, produced by Nihon Kayaku), D-1173 (trade name, acetophenone type sensitizer, produced by Merck Co., Ltd.) and benzophenone (produced by Kanto Kagaku Co.) as the photosensitizers, trialkyl aluminum (hereinafter referred to simply as Al-TR) and triphenylsilyl-t-butyl-peroxide (hereinafter referred to simply as 3ϕPl) as aluminum and silicon compounds of photopolymerization initiators, the compositions belonging to the first invention were prepared according to the formulations of the above compounds as essential materials of the present invention as shown in Table 1.

COMPARATIVE EXAMPLES 1–4

Compositions prepared by formulating an epoxyacrylate (abbreviated as DYEPAC) which is 1:1 addition product of cyclohexene epoxide ester (ERL-4221, trade name, produced by UCC Inc.) and acrylic acid conventionally used in the prior art as the base resin.

TABLE 1

|  |  | Main component | | Auxiliary ECON- | Photosensitizer | | | |
|---|---|---|---|---|---|---|---|---|
|  |  | VHEA | DYEPAC | 102S | D-1173 | Benzo-phenone | 3φP1 | Al-TR |
| Example | 1 | 100 | — | — | 6 | — | 2 | 1 |
|  | 2 | 100 | — | — | — | 6 | 2 | 1 |
|  | 3 | 80 | — | 20 | 6 | — | 2 | 1 |
|  | 4 | 80 | — | 20 | 6 | — | 2 | 1 |
|  | 5 | 80 | — | 20 | 4 | 2 | 2 | 1 |
|  | 6 | 80 | — | 20 | 4 | 2 | 1 | 0.5 |
|  | 7 | 70 | — | 30 | 6 | — | 2 | 1 |
|  | 8 | 70 | — | 30 | — | 6 | 2 | 1 |
| Comparative example | 1 | — | 100 | — | 6 | — | 2 | 1 |
|  | 2 | — | 100 | — | — | 6 | 2 | 1 |
|  | 3 | — | 80 | 20 | 6 | — | 2 | 1 |
|  | 4 | — | 80 | 20 | — | 6 | 2 | 1 |

These compositions were applied according to conventional methods on aluminum plates, TFS (Tin Free Steel) plates and tin plates. Then, these were introduced into a photocuring box in which air-cooling mercury lamp of 80 W/cm was arranged 6 cm above the conveyor surface and irradiated for 1 to 5 seconds. After irradiation, coating thickness, coating hardness (pencil hardness), coating adhesiveness (checker peel-off) and flexural test (180° bending) were tested and the results obtained are shown in Table 2. Also, simple comparison about characteristics of acrylic resins between Examples and Comparative examples is shown in Table 3.

TABLE 2

|  |  | Coating adhesiveness | | | Pencil hardness | Flexural test |
|---|---|---|---|---|---|---|
|  |  | Aluminum | TFS | Tin | | |
| Example | 1 | 50/100 | 40/100 | 0/100 | H | Δ |
|  | 2 | 50/100 | 40/100 | 0/100 | H | Δ |
|  | 3 | 100/100 | 100/100 | 80/100 | 2H | O |
|  | 4 | 100/100 | 100/100 | 80/100 | 2H | O |
|  | 5 | 100/100 | 100/100 | 70/100 | 2H | O |
|  | 6 | 100/100 | 100/100 | 70/100 | 2H | Δ |
|  | 7 | 100/100 | 100/100 | 90/100 | 2H | Δ |
|  | 8 | 100/100 | 100/100 | 90/100 | 2H | Δ |
| Comparative example | 1 | 20/100 | 10/100 | 0/100 | H | X |
|  | 2 | 10/100 | 10/100 | 0/100 | H | X |
|  | 3 | 80/100 | 50/100 | 10/100 | 2H | Δ |
|  | 4 | 80/100 | 50/100 | 10/100 | 2H | Δ |

Note (1) "100/100" means that no peel was observed at the peeling test on checkers.
Note (2) With regard to the flexural test, O represents no occurence of cracks on the cotaing film, Δ represents the slight occurence of cracks, and X represents the remarkable occurence of cracks.

TABLE 3

|  | Curing speed | Viscosity |
|---|---|---|
| Example VHEA | 1 sec. (HB) | 2,500 cPs |
| Comparative example DYEPAC | 5 sec. (HB) | 180,000 cPs |

EXAMPLES 9 TO 16

Synthesis of an epoxy resin modified with acrylic acid (hereinafter abbreviated to as HEA)

Into a four-necked flask equipped with a thermometer, a reflux condenser, a $N_2$ gas inlet and a stirrer, 210 g of vinylcyclohexene epoxide (trade name: ERL-4206, produced by UCC, alicyclic epoxide, epoxy equivalent: 70), 117 g of acrylic acid, 400 g of toluene, 0.001 g of hydroquinone and 1.56 g of choline chloride as the catalyst were charged. The mixture was gradually elevated in temperature under stirring and the reaction was carried out under the reflux temperature of toluene. Progress of the reaction was monitored by measuring the amount of consumed acrylic acid with 0.1N standard NaOH solution, and the reaction was terminated when acid value becames substantially 0. After completion of the reaction, the reaction solution was mixed with one liter of deionized water, washed three times and then the toluene layer was separated by a separating funnel, followed by evaporation of toluene under reduced pressure. The HEA synthesized had a viscosity of 25 poise (25° C.) and an epoxy equivalent of 94.

By using HEA as the modified compound, trisethylacetoacetatoaluminum (hereinafter abbreviated to as TEAAl) as the organometallic compound, triphenylsilyl-t-butyl peroxide (hereinafter abbreviated to as TPSiPO) as the organic silicon compound, Ionol (trade name, produced by Shell Petroleum Co., 2,6-di-t-butyl-p-cresol) and Kayama PM-2 (trade name, produced by Nihon Kayaku, bis-ethylacrylate phosphate) as the antioxidants and Darocure D-1173 (trade name, produced by Merck Co., Ltd.) as the photosensitizer, the photocurable compositions 9–16 of the present invention were obtained by mixing according to the compositions as shown in Table 4.

COMPARATIVE EXAMPLES 5 AND 6

The comparative photocurable compositions 5 and 6 were obtained by mixing according to the compositions as shown in Table 4 in the same manner as in Examples, except for adding no modifier.

TABLE 4

|  |  | HEA | TEAAl | TDSiPO | Benzo-phenone | D-1173 | Ionol | Kayama PM-2 |
|---|---|---|---|---|---|---|---|---|
| Example | 9 | 100 | 0.5 | 1.0 | 4 | — | 0.5 | — |
|  | 10 | 100 | 0.5 | 1.0 | 4 | — | 0.5 | 1.0 |
|  | 11 | 100 | 0.5 | 1.0 | 4 | — | — | 1.0 |
|  | 12 | 100 | 0.5 | 1.0 | — | 6 | 0.5 | — |
|  | 13 | 100 | 0.5 | 1.0 | — | 6 | 0.5 | 1.0 |
|  | 14 | 100 | 0.5 | 1.0 | — | 6 | — | 1.0 |

TABLE 4-continued

|  | | HEA | TEAAl | TDSiPO | Benzo-phenone | D-1173 | Ionol | Kayama PM-2 |
|---|---|---|---|---|---|---|---|---|
|  | 15 | 100 | — | — | 4 | — | 0.5 | 1.0 |
|  | 16 | 100 | — | — | — | 6 | 0.5 | 1.0 |
| Comparative example | 5 | 100 | 0.5 | 1.0 | 4 | — | — | — |
|  | 6 | 100 | 0.5 | 1.0 | — | 6 | — | — |

The compositions obtained were applied on aluminum plates (0.3 mm thickness) and the coated products obtained were introduced into a photocuring box in which a 80 W/cm air-cooling mercury lamp was arranged 10 cm above the conveyor surface to prepare test strips. The time required for photocuring was 1 to 10 seconds. For showing light resistance, heat resistance and weathering resistance possessed by the cured product of the composition of the present invention, the following evaluation tests were practiced. The results are shown in Table 5.

Weathering resistance ... Accelerated weathering resistance test was conducted 24 hours and 50 hours later by weather meter based on JIS K 5400, and yellow discoloration and others were judged;

Heat resistance ... Left to stand in an oven at 200° C. for 2 seconds and yellow discoloration was observed with eyes;

Light resistance ... Yellow discoloration of the coated film when irradiated for 10 seconds by one high pressure mercury lamp of 80 W/cm of photocuring device (produced by Toshiba Denzai Co.) at a height of 8 cm was judged by observation with eyes.

TABLE 5

|  |  | Weather meter test | | UV-ray irradiation test | Oxidation test (200° C., |
|---|---|---|---|---|---|
|  |  | 24 hours | 50 hours | (60 sec.) | 2 sec.) |
| Example | 9 | transparent | transparent | transparent | transparent |
|  | 10 | transparent | transparent | transparent | transparent |
|  | 11 | transparent | Pale yellow discoloration | transparent | transparent |
|  | 12 | transparent | transparent | transparent | transparent |
|  | 13 | transparent | transparent | transparent | transparent |
|  | 14 | transparent | Pale yellow discoloration | transparent | Pale yellow discoloration |
|  | 15 | transparent | transparent | transparent | transparent |
|  | 16 | transparent | transparent | transparent | transparent |
| Comparative Example | 5 | Yellow discoloration | Brown | Pale yellow discoloration | Yellow discoloration |
|  | 6 | Yellow discoloration | Brown | Pale yellow discoloration | Yellow discoloration |

EXAMPLES 17–24

Into a four-necked flask equipped with a thermometer, a reflux condenser, a $N_2$ gas inlet and a stirrer, 280 g (2.0 mole) of ERL-4206 (trade name, produced by UCC Co., vinylcyclohexene diepoxide, epoxy equivalent: 70), 72 g (1.0 mole) of acrylic acid (produced by Wako Junyaku Co.), one liter of toluene, 0.01 g of p-methoxyphenol and 1.20 g of tetrabutylammonium chloride as the catalyst were charged, the mixture was gradually elevated in temperature under stirring and the reaction was carried out under the reflux temperature of toluene.

Progress of the reaction was monitored by measuring the amount of consumed acrylic acid with 0.1N standard NaOH solution, and the reaction was terminated when an acid value becames substantially 0. After completion of the reaction, the reaction solution was mixed with one liter of deionized water, washed 3 times and then the toluene layer was separated by a separating funnel, followed by evaporation of toluene under reduced pressure. The compound synthesized was an acrylated epoxy resin (hereinafter abbreviated as VHEA) having a viscosity of 25 poise (25° C.) and an epoxy equivalent of 480. In addition to the VHEA obtained, by use of FC-430 and Modaflow (fluorine type surfactant, produced by Sumitomo 3M Co.) as the leveling agent, D-1173 (acetophenone type sensitizer, produced by Merck Co.) and benzophenone (produced by Kanto Kagaku) as the photosensitizers, trialkylaluminum (abbreviated as Al-TR) and triphenylsilyl-t-butyl peroxide (abbreviated as 3φPl) as the aluminum/silanol typecatalyst as the photoinitiator, and an epoxy compound (E-102S, trade name, cresol novolac epoxy resin, produced by Nihon Kayaku K.K.) as other additive, the compositions of the invention were prepared according to the formulations of the above compounds as essential materials of the present invention as shown in Table 6.

COMPARATIVE EXAMPLES 7–10

Compositions were prepared by formulating a bisphenol A type epoxyacrylate B-540 (trade name, produced by Osaka Yuki Kagaku K.K.), diluent: trimethylolpropane triacrylate (TMPTA) as the base resin.

TABLE 6

|  |  | Example | | | | | | | | Comparative example | | | |
|---|---|---|---|---|---|---|---|---|---|---|---|---|---|
|  |  | 17 | 18 | 19 | 20 | 21 | 22 | 23 | 24 | 7 | 8 | 9 | 10 |
| Main component | VHEA | 100 | 100 | 80 | 80 | 80 | 80 | 80 | 80 | — | — | — | — |
|  | B-540 | — | — | — | — | — | — | — | — | 100 | 100 | 80 | 80 |

TABLE 6-continued

|  |  | Example | | | | | | | | Comparative example | | | |
|---|---|---|---|---|---|---|---|---|---|---|---|---|---|
|  |  | 17 | 18 | 19 | 20 | 21 | 22 | 23 | 24 | 7 | 8 | 9 | 10 |
| Auxiliary Sensitizer | E-102S | — | — | 20 | 20 | 20 | 20 | 20 | 20 | — | — | 20 | 20 |
|  | D-1173 | 6 | 4 | 6 | 6 | 4 | 4 | 4 | 4 | 6 | 4 | 6 | 4 |
|  | Benzophenone | — | 2 | — | — | 2 | 2 | 2 | 2 | — | 2 | — | 2 |
| Photoinitiator | 3φP1 | 2 | 2 | 2 | 2 | 2 | 2 | 2 | 2 | 2 | 2 | 2 | 2 |
|  | Al-TR | 1 | 1 | 1 | 1 | 1 | 1 | 1 | 1 | 1 | 1 | 1 | 1 |
| Levelling agent | FC-430 | 0.3 | — | 0.3 | — | 0.3 | — | — | — | 0.3 | — | 0.3 | — |
|  | Modaflow | — | — | — | — | — | — | 0.3 | — | — | — | — | — |

These compositions were applied on tinplates having undercoat layers comprising thermosetting resins in conventional manner, respectively. Then, these were introduced into a photocuring box in which as air-cooling mercury lamp of 80 W/cm was arranged at a height of 6 cm above the conveyor surface, and irradiated for 1 to 5 seconds. After completion of irradiation, the surface state was observed with eyes to measure the levelling characteristic, and the gloss by means of a gloss meter. The results are shown in Table 7.

TABLE 7

|  |  | Appearance of surface | Gloss (%) |
|---|---|---|---|
| Example | 17 | Uniform coated film | 92 |
|  | 18 | Orange peel | 88 |
|  | 19 | Uniform coated film | 97 |
|  | 20 | Orange peel | 72 |
|  | 21 | Uniform coated film | 99 |
|  | 22 | Crater-like | 69 |
|  | 23 | Uniform coated film | 95 |
|  | 24 | Crater-like | 62 |
| Comparative example | 7 | Slightly like orange peel | 90 |
|  | 8 | Crater-like | 66 |
|  | 9 | Slightly like orange peel | 91 |
|  | 10 | Crater-like | 57 |

From the above results, the composition of the present invention were shown to exhibit excellent levelling chracterictic by addition of levelling agents such as FC-430 and Modaflow.

EXAMPLES 25-28

The compositions of the present invention were obtained in the same manner as in Examples 17-24, except for adding the additives shown below (in Table 8) to the main compositions used in Examples 17-24.

TABLE 8

|  |  | Example | | | |
|---|---|---|---|---|---|
|  |  | 25 | 26 | 27 | 28 |
| Main component | VHEA | 80 | 80 | 80 | 80 |
| Auxiliary Sensitizer | F-102S | 20 | 20 | 20 | 20 |
|  | D-1173 | 4 | 4 | 4 | 4 |
| Photoinitiator | 3φP1 | 2 | 2 | 2 | 2 |
|  | Al-TR | 1 | 1 | 1 | 1 |
| Levelling agent or Additive | FC-430 | 0.3 | 0.3 | 0.3 | 0.3 |
|  | Tetramethyl disiloxane | 0.05 | — | — | — |
|  | Lauric acid ester | — | 0.1 | — | — |
|  | Cobalt naphthenate | — | — | 0.2 | — |

TABLE 8-continued

|  | Example | | | |
|---|---|---|---|---|
|  | 25 | 26 | 27 | 28 |
| Toluene | — | — | — | 0.1 |

The above compositions were photocured similarly as in Examples 17-24 to obtain the results as shown in Table 9. The drying characteristic is indicated in terms of representations of tacky (T), untacky (U) and tack free (TF).

TABLE 9

|  | Appearance of surface | Gloss (%) | Drying |
|---|---|---|---|
| Example 25 | Uniform coated film, no crater | 98 | U |
| Example 26 | Uniform coated film, no crater | 96 | U |
| Example 27 | Uniform coated film | 94 | TF |
| Example 28 | Uniform coated film | 100 | T |

As apparently seen from the above results, it has been found that coated films with excellent uniformity can be obtained within short time by addition of various additives to the photocurable composition of the present invention.

EXAMPLES 29-36

In addition to VHEA prepared in the above Examples, cresol novolac type epoxy resins EOCN-102S (trade name, melting point: 50° C. or higher, produced by Nihon Kayaku Co.) and ECN-1235 (trade name, melting point: 40° C. or higher, produced by Ciba-Geigy AG.) were employed as the adhesion enhancer, and methacryloyloxyethyl phosphate (hereinafter abbreviated as MAEP) as the adhesiveness imparting agent. Further, as the photosensitivizer, D-1173 (acetophenone type sensitizer, produced by Merck Co.) and benzophenone (produced by Kanto Kagaku) were employed to provide essential materials of the invention.

Various materials as mentioned above were formulated according to the compositions (represented by parts by weight) shown in Table 10 to prepare compositions belonging to the second embodiment of this invention as shown below.

COMPARATIVE EXAMPLES 11-14

As comparative examples, compositions in which epoxyacrylate (hereinafter abbreviated to as DYEPAC) conventionally used in the art was formulated as the base resin were prepared.

TABLE 10

| | | Main component | | Auxiliary | | | Photo-sensitizer | |
|---|---|---|---|---|---|---|---|---|
| | | VHEA | DYEPAC | ECON-102S | ECN-1235 | MAEP | D-1173 | Benzo-phenone |
| Example | 29 | 100 | — | — | — | 2 | 6 | — |
| | 30 | 100 | — | — | — | 2 | — | 6 |
| | 31 | 80 | — | 20 | — | 2 | 6 | — |
| | 32 | 80 | — | 20 | — | 2 | — | 6 |
| | 33 | 80 | — | 20 | — | 2 | 4 | 2 |
| | 34 | 80 | — | 20 | — | — | 6 | — |
| | 35 | 80 | — | — | 20 | 2 | 6 | — |
| | 36 | 80 | — | — | 20 | 2 | — | 6 |
| Comparative example | 11 | — | 100 | — | — | 2 | 6 | — |
| | 12 | — | 100 | — | — | 2 | — | 6 |
| | 13 | — | 80 | — | 20 | 2 | 6 | — |
| | 14 | — | 80 | 20 | — | 2 | — | 6 |

These compositions were applied according to conventional methods on aluminum plates, TFS (Tin Free Steel) plates and tin plates. Then, these were introduced into a photocuring box in which air-cooled mercury lamp of 80 W/cm was arranged 10 cm above the conveyor surface and irradiated for 0.5 to 3.0 seconds. After irradiation, coating thickness, coating hardness (pencil hardness), coating adhesiveness (checker peel-off) and flexural test (180° bending) were tested and the results obtained are shown in Table 11.

TABLE 11

| | | Coating adhesiveness | | | Pencil hardness | Flexural test | Film thickness ($\mu$) |
|---|---|---|---|---|---|---|---|
| | | Aluminum | TFS | Tin | | | |
| Example | 29 | 60/100 | 50/100 | 10/100 | HB-H | O | 5 |
| | 30 | 70/100 | 40/100 | 20/100 | HB-H | O | 6 |
| | 31 | 90/100 | 90/100 | 30/100 | H | O | 6 |
| | 32 | 100/100 | 100/100 | 30/100 | H-2H | Δ | 6 |
| | 33 | 100/100 | 100/100 | 40/100 | 2H | O | 5 |
| | 34 | 90/100 | 70/100 | 30/100 | H-2H | Δ | 6 |
| | 35 | 100/100 | 100/100 | 20/100 | 2H | O | 7 |
| | 36 | 100/100 | 100/100 | 30/100 | H | O | 5 |
| Comparative example | 11 | 30/100 | 10/100 | 0/100 | H | X | 6 |
| | 12 | 30/100 | 0/100 | 0/100 | HB | X | 5 |
| | 13 | 100/100 | 50/100 | 0/100 | HB | Δ | 6 |
| | 14 | 100/100 | 70/100 | 0/100 | HB | X | 6 |

Note (1) Curing conditions: Three air-cooling type mercury lamps were used, irradiation time was 1 second, and these lamps were disposed 10 cm above the surface of the conveyor.
Note (2) "100/100" means that no peel-off was observed at the peeling test on checkers.
Note (3) With regard to the bending test, O represents no occurence of cracks on the cotaing film, Δ represents the slight occurence of cracks, and X represents the remarkable occurence of cracks.

As can clearly be seen from the above description, it has been confirmed that excellent cured films can be obtained according to the composition of the invention.

We claim:
1. A photocurable composition comprising:
(A) a first epoxy compound having at least one epoxy group and at least one photocurable unsaturated ethylenic double bond within the same molecule, said first epoxy compound being a reation product of an epoxy compound having a viscosity of 200 cPs or less and a compound having a photocurable unsaturated ethylenic double bond;
(E) a second epoxy compound, said second epoxy compound being other than an epoxy compound containing a photocurable unsaturated ethylenic double bond;
(F) an organic phosphorus compound selected from the group consisting of 2-methacryloyloxyethylphosphate, 2-acryloyloxyethylphosphate, diphenyl-2-methacryloyloxyethylphosphate, diphenyl-2-acryloyloxyethylphosphate, bismethacryloyloxybutylphosphate, bisacryloyloxybutylphosphate, diallyldibutylphosphonosuccinate, trimethylphosphate, triethylphosphate, tributylphosphate, trimethoxyphosphate, tributoxyphosphate, trisdichloropropylphosphate, triphenylphosphate, tricresylphosphate, triphenylphosphite, trilauryltrithiophosphite, dibutenylhydrogenphosphite, dibutylbutylphosphonate, di(2-ethylhexyl)-2-ethylhexylphosphonate and 2-ethylhexylphosphonic acid; and
(G) a photosensitizer other than said organic phosphorus compound.
2. A photocurable composition according to claim 1, wherein the second epoxy compound (E) is an epoxy-modified compound of a phenol novolac resin.
3. A photocurable composition according to claim 1, wherein the second epoxy compound (E) is formulated in an amount of 1 to 80% by weight based on the total amount of the first epoxy compound (A) and the second epoxy compound (E).
4. A photocurable composition according to claim 1, wherein the organic phosphorus compound (F) is a (meth)acryloyloxyalkyl phosphate compound.
5. A photocurable composition according to claim 1, wherein the organic phosphorus compound (F) is formulated in an amount of 0.01 to 10 parts by weight based on 100 parts by weight of the total amount of the first epoxy compound (A) and the second epoxy compound (E).
6. A photocurable composition according to claim 1, wherein the photosensitizer (G) is formulated in an amount of 0.01 to 10 parts by weight based on 100 parts by weight of the total amount of the first epoxy compound (A) and the second epoxy compound (E).
7. A photocurable composition according to claim 1, wherein the first epoxy compound is an acrylic acid epoxy resin, the second epoxy compound is a cresol novolac epoxy resin, the organic phosphorous compound is methacryloyloxyethyl phosphate, and the photosensitizer is an acetophenone sensitizer.